United States Patent
Faase et al.

(10) Patent No.: US 7,447,891 B2
(45) Date of Patent: Nov. 4, 2008

(54) LIGHT MODULATOR WITH CONCENTRIC CONTROL-ELECTRODE STRUCTURE

(75) Inventors: Kenneth James Faase, Corvallis, OR (US); Adel Jilani, Corvallis, OR (US); James McKinnell, Corvallis, OR (US); Eric L. Nikkel, Corvallis, OR (US); Arthur R. Piehl, Corvallis, OR (US); James R. Przybyla, Corvallis, OR (US); Bao Yeh, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 279 days.

(21) Appl. No.: 11/233,045

(22) Filed: Sep. 21, 2005

(65) Prior Publication Data

US 2006/0017689 A1    Jan. 26, 2006

Related U.S. Application Data

(63) Continuation of application No. 10/428,247, filed on Apr. 30, 2003, now Pat. No. 7,370,185.

(51) Int. Cl.
*G02B 1/10* (2006.01)
*G02B 26/00* (2006.01)

(52) U.S. Cl. .................. 713/1; 713/300; 359/230; 359/260; 359/290; 359/291; 359/293; 359/578; 359/580; 359/584; 359/589

(58) Field of Classification Search ......... 713/1, 713/300; 359/230, 260, 290–293, 578, 580, 359/584, 589
See application file for complete search history.

(56) References Cited

U.S. PATENT DOCUMENTS

| | | | |
|---|---|---|---|
| 5,181,013 A | 1/1993 | Bagshaw et al. | |
| 5,771,321 A | 6/1998 | Stern | |
| 5,835,255 A | 11/1998 | Miles | |
| 5,969,848 A | 10/1999 | Lee et al. | |
| 5,986,796 A | 11/1999 | Miles et al. | |
| 6,025,951 A | 2/2000 | Swart et al. | |
| 6,031,653 A | 2/2000 | Wang et al. | |
| 6,040,936 A | 3/2000 | Kim et al. | |
| 6,040,937 A | 3/2000 | Miles | |
| 6,154,591 A | 11/2000 | Kershaw | |
| 6,341,039 B1 | 1/2002 | Flanders et al. | |

(Continued)

FOREIGN PATENT DOCUMENTS

EP    1139159    10/2001

(Continued)

OTHER PUBLICATIONS

V. Milanovic "MEMS Technologies for Optical Applications" IEEE Dec. 2002.

(Continued)

*Primary Examiner*—Abdelmoniem Elamin

(57) ABSTRACT

An electronic device for at least partially displaying a pixel of an image, the device comprising first and second reflectors defining an optical cavity therebetween, the optical cavity being selective of an electromagnetic wavelength at an intensity by optical interference, the device having a concentric control structure comprising at least an inner and an outermost electrode, the optical cavity being controlled only by the inner electrode.

34 Claims, 2 Drawing Sheets

U.S. PATENT DOCUMENTS

| | | |
|---|---|---|
| 6,373,632 B1 | 4/2002 | Flanders |
| 6,381,022 B1 | 4/2002 | Zavracky |
| 6,384,952 B1 | 5/2002 | Clark et al. |
| 6,392,341 B2 | 5/2002 | Jacobsen et al. |
| 6,400,738 B1 | 6/2002 | Tucker et al. |
| 6,407,851 B1 | 6/2002 | Islam et al. |
| 6,433,917 B1 | 8/2002 | Mei et al. |
| 6,647,171 B1 | 11/2003 | Fu et al. |
| 6,650,455 B2 | 11/2003 | Miles |
| 6,674,562 B1 | 1/2004 | Miles |
| 6,680,792 B2 | 1/2004 | Miles |
| 6,724,785 B1 | 4/2004 | Tucker et al. |
| 6,798,550 B1 | 9/2004 | Wang et al. |
| 6,822,798 B2 | 11/2004 | Wu et al. |
| 6,833,958 B2 * | 12/2004 | Rankin et al. ............ 359/580 |
| 6,900,440 B2 | 5/2005 | Reed et al. |
| 7,370,185 B2 * | 5/2008 | Piehl et al. ............ 713/1 |
| 2001/0003487 A1 | 6/2001 | Miles |
| 2002/0015215 A1 | 2/2002 | Miles |
| 2002/0024711 A1 | 2/2002 | Miles |
| 2002/0054424 A1 | 5/2002 | Miles |
| 2002/0075555 A1 | 6/2002 | Miles |
| 2002/0080504 A1 | 6/2002 | Atla |
| 2002/0126364 A1 | 9/2002 | Miles |
| 2002/0149828 A1 | 10/2002 | Miles et al. |
| 2003/0025981 A1 | 2/2003 | Ishikawa et al. |
| 2003/0043157 A1 | 3/2003 | Miles |
| 2003/0072070 A1 | 4/2003 | Miles |
| 2003/0209669 A1 * | 11/2003 | Chou ............ 250/343 |
| 2004/0027029 A1 | 2/2004 | Borwick, III et al. |
| 2004/0196525 A1 | 10/2004 | Fujii et al. |
| 2004/0217919 A1 | 11/2004 | Piehl et al. |
| 2004/0218251 A1 | 11/2004 | Piehl et al. |
| 2004/0240032 A1 | 12/2004 | Miles |

FOREIGN PATENT DOCUMENTS

| | | |
|---|---|---|
| EP | 1146325 A2 | 10/2001 |
| WO | WO 99/34484 A | 7/1999 |
| WO | WO 01/67171 A | 9/2001 |
| WO | WO 02/075872 A | 9/2002 |
| WO | WO 02/086582 A | 10/2002 |
| WO | WO02/091059 | 11/2002 |

OTHER PUBLICATIONS

U. Krishnamoorthi et al. "Dual-mode Micromirrors for Optical Phased Array Applications," 11th Int. Conf. Solid-State Sensors & Actuators, Jun. 2001.

V. Milanovic et al., "Torsional Micromirrors with Lateral Actuators" Transducers '01, Munich, Germany (Jun. 2001).

J. Jerman et al. "A Miniature Fabry-Perot Interferometer . . ." IEEE Solid State Sensor and Actuator Workshop, Jun. 1990 pp. 140-144.

J. Jerman et al. "A Miniature Fabry-Perot Interferometer Fabricated . . ." IEEE Solid State Sensor and Actuator Workshop, Jun. 1988 pp. 16-18.

S. R. Mallinson et al., "Miniature Micromachined Fabry-Perot Interferometers in Silicon," Electronics Ltrs. 23 (20) Sep. 1987, pp. 1041-1043.

\* cited by examiner

LIGHT MODULATOR WITH CONCENTRIC CONTROL-ELECTRODE STRUCTURE

CROSS-REFERENCE TO RELATED APPLICATION

This application is related to commonly assigned application Ser. No. 10/428,247, filed Apr. 30, 2003, now U.S. Pat. No. 7,370,185, the entire disclosure of which is incorporated herein by reference.

TECHNICAL FIELD

This invention relates generally to light modulator devices and more particularly to Fabry-Perot interferometers used for light modulation.

BACKGROUND

There are many applications for light modulator devices that have high spatial and time resolution and high brightness, including applications in displays of information for education, business, science, technology, health, sports, and entertainment. Some light modulator devices, such as digital light-mirror arrays and deformographic displays, have been applied for large-screen projection. For white light, light modulators such as the reflective digital mirror arrays have been developed which have high optical efficiency, high fill-factors with resultant low pixelation, convenient electronic driving requirements, and thermal robustness.

Macroscopic scanners have employed mirrors moved by electromagnetic actuators such as "voice-coils" and associated drivers. Micro-mirror devices have used micro-actuators based on micro-electro-mechanical-system (MEMS) techniques. MEMS actuators have also been employed in other applications such as micro-motors, micro-switches, and valves for control of fluid flow. Micro-actuators have been formed on insulators or other substrates using micro-electronic techniques such as photolithography, vapor deposition, and etching.

A micro-mirror device can be operated as a light modulator for amplitude and/or phase modulation of incident light. One application of a micro-mirror device is in a display system. In such a system, multiple micro-mirror devices are arranged in an array such that each micro-mirror device provides one cell or pixel of the display. A conventional micro-mirror device includes an electrostatically actuated mirror supported for rotation about an axis of the mirror into either one of two stable positions. Thus, such a construction serves to provide both light and dark pixel elements corresponding to the two stable positions. For gray scale variation, binary pulse-width modulation has been applied to the tilt of each micro-mirror. Thus, conventional micro-mirror devices have frequently required a high frequency oscillation of the mirror and frequent switching of the mirror position and thus had need for high frequency circuits to drive the mirror. Binary pulse-width modulation has been accomplished by off-chip electronics, controlling on- or off-chip drivers.

Conventional micro-mirror devices must be sufficiently sized to permit rotation of the mirror relative to a supporting structure. Increasing the size of the micro-mirror device, however, reduces resolution of the display since fewer micro-mirror devices can occupy a given area. In addition, applied energies must be sufficient to generate a desired force needed to change the mirror position. Also, there are applications of micro-mirror devices that require positioning of the mirror in a continuous manner by application of an analog signal rather than requiring binary digital positioning controlled by a digital signal. Accordingly, it is desirable to minimize the size of a micro-mirror device so as to maximize the density of an array of such devices, and it is desirable as well to provide means for controlling the micro-mirror device in an analog manner.

Micro-electromechanical systems (MEMS) are systems which are typically developed using thin film technology and include both electrical and micro-mechanical components. MEMS devices are used in a variety of applications such as optical display systems, pressure sensors, flow sensors, and charge-control actuators. MEMS devices of some types use electrostatic force or energy to move or monitor the movement of micro-mechanical electrodes, which can store charge. In one type of MEMS device, to achieve a desired result, a gap distance between electrodes is controlled by balancing an electrostatic force and a mechanical restoring force.

MEMS devices designed to perform optical functions have been developed using a variety of approaches. According to one approach, a deformable deflective membrane is positioned over an electrode and is electrostatically attracted to the electrode. Other approaches use flaps or beams of silicon or aluminum, which form a top conducting layer. For such optical applications, the conducting layer is reflective while the deflective membrane is deformed using electrostatic force to direct light which is incident upon the conducting layer.

More specifically, MEMS of a type called optical interference devices produce colors based on the precise spacing of a pixel plate relative to a lower plate (and possibly an upper plate). This spacing may be the result of a balance of two forces: electrostatic attraction based on voltage and charge on the plate(s), and a spring constant of one or more "support structures" maintaining the position of the pixel plate away from the electrostatically charged plate. One known approach for controlling the gap distance is to apply a continuous control voltage to the electrodes, where the control voltage is increased to decrease the gap distance, and vice-versa. However, precise gap distance control and maintenance of reflector parallelism may be affected by several factors, including material variations between support structures, misalignment in lithographic methods used in device fabrication, undesired tilt of reflecting surfaces, and other variations. While various light modulator devices have found widespread success in their applications, there are still unmet needs in the field of micro-optical light modulator devices.

BRIEF DESCRIPTION OF THE DRAWINGS

The features and advantages of the disclosure will readily be appreciated by persons skilled in the art from the following detailed description when read in conjunction with the drawings, wherein.

DETAILED DESCRIPTION OF EMBODIMENTS

Figure 1:
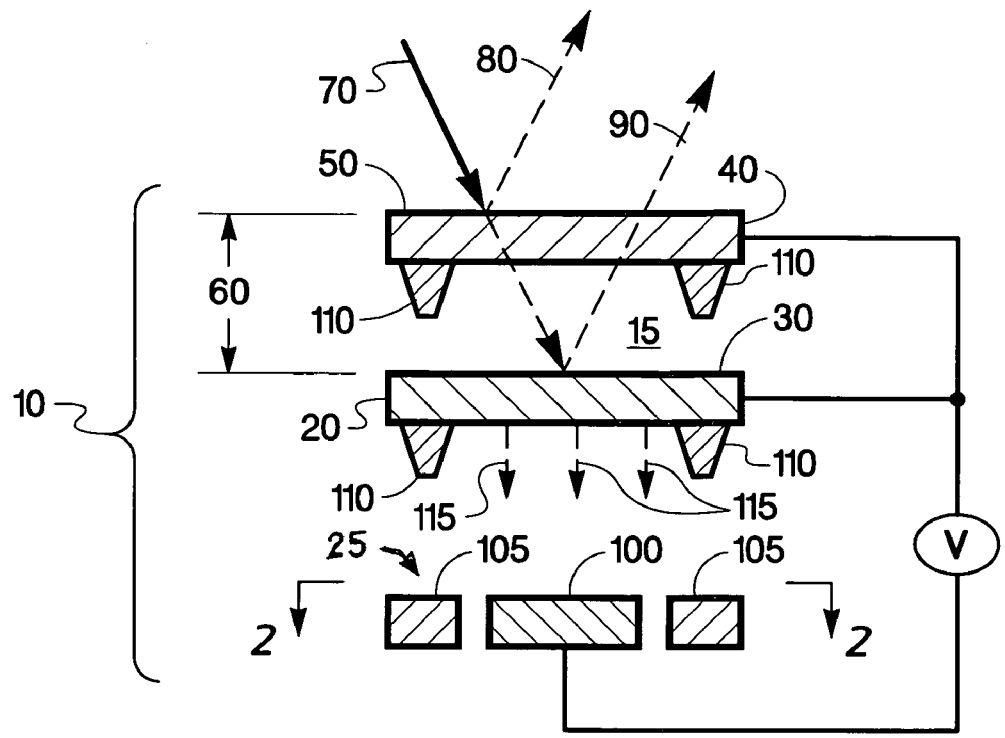
FIG. 1 is a simplified cross-sectional side elevation view of an embodiment of a light modulator device.

For clarity of the description, the drawings are not drawn to a uniform scale. In particular, vertical and horizontal scales may differ from each other and may vary from one drawing to another. In this regard, directional terminology, such as "top," "bottom," "front," "back," "leading," "trailing," etc., is used with reference to the orientation of the drawing figure(s) being described. Because components of the invention can be positioned in a number of different orientations, the directional terminology is used for purposes of illustration and is in no way limiting.

The term "reflector" is used throughout this description and the accompanying claims to mean a surface that is at least partially reflective of electromagnetic radiation. A reflector surface may be intentionally made only partially reflective to allow a portion of incident light to be transmitted, as is conventionally done in the construction of Fabry-Perot interferometers, for example.

One aspect of the invention provides embodiments of an electronic light modulator device for at least partially displaying a pixel of an image. The device has first and second reflectors defining an optical cavity between them. The optical cavity can select an electromagnetic wavelength at an intensity by optical interference. A concentric control-electrode structure has at least an inner and an outer electrode, the optical cavity being controlled only by the inner electrode. Various embodiments of the electronic light modulator device may be formed as MEMS devices. The two reflectors may form a Fabry-Perot interferometer. A Fabry-Perot interferometer has at least two substantially parallel surfaces separated by an optical gap, for reflecting electromagnetic radiation such that interference occurs between beams reflected from the parallel reflector surfaces.

FIG. 1 shows a simplified cross-sectional side-elevation view of a first embodiment of a light modulator device 10. As shown in FIG. 1, light modulator device 10 has two reflector plates 20 and 40. Reflector plate 20 has a reflective top surface 30. Reflector plate 40 has a partially reflective top surface 50, which reflects a portion of incident light beam 70 into a first reflected beam 80 and allows another portion of incoming light beam 70 to be transmitted to the reflective top surface 30 of reflector plate 20, where it is reflected into second reflected beam 90. First and second reflected beams 80 and 90 may undergo interference, depending on the optical path difference between the two reflected beams, caused by optical gap 60. If incident light beam 70 were monochromatic, interference between reflected beams 80 and 90 would cause a series of maxima and minima of light intensity as optical gap 60 was varied. If incident light beam 70 consists of white light (polychromatic light), interference between reflected beams 80 and 90 can select a series of colors at respective light intensities as optical gap 60 is varied. Optical gap 60 is varied by varying the spacing 15 between reflector plates 20 and 40.

While, for simplicity and clarity of the description, optical gap distance 60 is shown in FIG. 1 as being characterized by a distance measured perpendicular to reflective surfaces 30 and 50 of plates 20 and 40, those skilled in the art will recognize that the optical path difference between reflected beams 80 and 90 that is effective in causing the interference is measured along the reflected beams themselves and also takes into account in a known manner the refractive index and thickness of any material through which one or both of the interfering beams may be transmitted.

Light modulator device 10 has a concentric control-electrode structure 25 comprising at least inner electrostatic control electrode 100 and outermost electrode 105. Inner control electrode 100 may be electrically charged to provide control of optical gap distance 60. A suitable electric potential applied to inner electrostatic control electrode 100 moves reflector plate 20, as shown by dashed arrows 115 in FIG. 1. Outermost electrode 105 may be electrically coupled to reflector plate 20, reflector plate 40, or both. In particular, outermost electrode 105 may be electrically shorted to reflector plate 20, reflector plate 40, or both.

Stops 110 prevent reflector plate 20 from contacting inner control electrode 100 or outer electrode 105 and prevent reflector plate 20 from contacting reflector plate 40 (thus preventing stiction in either case). Stops 110 also determine the minimum spacing for mechanical offset of the plates from each other. Stops 110 may be formed of a conventional electrically insulating material or electrical conductors shorted to the plates they are attached to. Electrical conductors can are used for stops in electrical configurations where no voltage bias is used between contacting plates. In other embodiments, similar stops may be used on the top sides of the plates 105 and/or 20 in addition and/or alternatively to the stops 110 shown in the drawings.

In none of the states of the device does any plate come into contact with another plate of the device structure, i.e., there is always a non-zero minimum spacing between plates. Thus, reflector plate 40 never contacts reflector plate 20, and reflector plate 20 never contacts inner control electrode 100 or outermost electrode 105.

Light modulator device 10 may be fabricated as a micro-electro-mechanical-system (MEMS) device. Such MEMS devices are typically developed and manufactured using thin film and semiconductor-like technology and include both electrical and micro-mechanical components. For example, many such devices can be formed simultaneously on a silicon wafer in a batch process. In known fabrication methods for MEMS devices, the various elements of each device are formed in fixed spatial relationships until the fabrication is nearly complete, and then etching is used to release those particular elements that must be free to move. FIG. 1 shows light modulator device 10 in its initial as-released state, where the optical gap distance is 60 as shown. When no electrostatic potential is applied to inner control electrode 100, inner control electrode 100 and reflector plate 20 are at the same potential. Such a state may be called the "as-released state."

Figure 2:
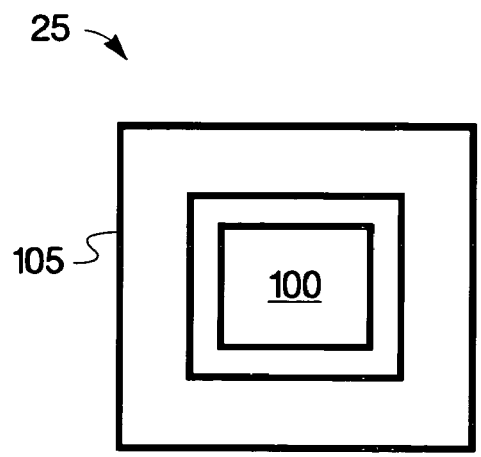
FIG. 2 is a top plan view of an embodiment of a control-electrode structure of a light modulator device.

FIG. 2 shows a top plan view of an embodiment of a concentric control-electrode structure 25 of a light modulator device 10, comprising inner control electrode 100 and outer electrode 105. In the embodiment shown in FIG.2, annular outer electrode 105 surrounds inner control electrode 100. While FIG. 2 shows inner control electrode 100, outer electrode 105, and the whole control-electrode structure 25 as square, each of these may be rectangular, triangular, hexagonal, round, elliptical, etc., or any other concentric shapes.

Thus, another aspect of the invention is an embodiment of a Fabry-Perot interferometer having substantially parallel first and second reflector plates 40 and 20 having first and second reflecting surfaces 50 and 30 respectively. The first and second reflecting surfaces 30 and 50 are spaced apart by a variable optical gap 60 between the first and second reflecting surfaces. The first and second reflecting surfaces, together with the variable optical gap 60, cause interference of electromagnetic radiation incident on the Fabry-Perot interferometer. At least one of the first and second reflecting plates is movable. This embodiment of a Fabry-Perot interferometer also has a fixed electrostatic control structure 25 adapted to control the variable optical gap by application of a control voltage. The control structure comprises at least two concentric electrodes, an inner electrode 100 and an outermost electrode 105. Only inner electrode 100 has a control voltage applied to it to control the variable optical gap 60. The control structure 25 is spaced apart from the first reflector plate 40 by a first distance and is spaced apart from the second reflector plate 20 by a second distance smaller than the first distance.

For example, the second reflector plate 20 may be disposed between the first reflector plate 40 and the control structure 25, and the first reflecting plate 40 may be disposed above the second reflecting plate 20, as shown by the embodiment illustrated in FIG. 1.

As the electrostatic potential difference between inner electrode 100 and reflector plate 20 is varied over a range, e.g., about zero to about 14 volts in one embodiment, movable reflector plate 20 varies in a non-linear manner over a range of displacement, e.g., plus or minus about 0.1 to 0.5 micrometer from the as-released configuration. The displacement is determined by the wavelength of light being intensity modulated or filtered. Corresponding to the range of displacements in this embodiment, the optical gap may be varied over a range of about 270 nanometers to about 340 nanometers, for example. The electrostatic potential difference (or "pixel plate voltage") is tuned to set the optical gap to select a wavelength at an intensity, employing the optical interference as in a Fabry-Perot interferometer. Those skilled in the art will recognize that the resulting displayed output intensity depends upon a number of geometrical factors as well as on the intensity of the incident light and that the quantitative relationship between the selected wavelengths and the pixel plate voltages depends on various factors such as refractive indices of materials employed and the stiffness of flexural support elements supporting movable reflector plate 20.

The control voltage of the Fabry-Perot interferometer device embodiments may be continuously controllable by an analog signal, by a digital signal, or by selecting among a discrete number of signals. The digital signal may have a binary value such that a binary zero sets one of the first and second optical states, and a binary one sets the other of the first and second optical states. Alternatively, the digital signal may employ several bits, and conventional digital-to-analog conversion techniques may be used to convert the digital signal to a suitable range of analog electrical potentials. In another embodiment one of a discrete number of voltages may be selected and used as the control voltage, each discrete voltage corresponding to a specific optical state.

Various embodiments may have various electrical configurations. For example, the inner electrode 100 may be grounded, and the second reflecting plate 20 may be electrically coupled to a signal source. The first reflecting plate 40 may be held at a fixed electric potential, which may be a potential that is above ground potential. Alternatively, the inner electrode 100 may be electrically coupled to a signal source, and the first and second reflecting plates may be electrically coupled as shown in FIG. 1. In such embodiments, the first and second reflecting plates may be electrically grounded. As mentioned above, outermost electrode 105 may be electrically coupled to reflector plate 20, reflector plate 40, or both. In particular, outermost electrode 105 may be electrically shorted to reflector plate 20, reflector plate 40, or both.

Thus, a control voltage or control signal applied to the inner portion of electrostatic control structure 25 may be used to move and control the position of at least one of the reflector plates, thereby controlling the optical gap and controlling the interference between beams 80 and 90. The variable optical gap is controlled by variably pulling the second reflecting plate toward the electrostatic control structure. Electrostatic control structure 25 may be centered under the second reflecting plate 20, first reflector plate 40, or both. Thus, at least one of the reflecting surfaces may be moved without appreciable tilt, and consequently the variable optical gap may be controlled without appreciable tilt of the reflecting surfaces. Otherwise, unwanted tilt could occur due to imbalance in the lengths, widths, or strengths of flexural elements supporting the reflector plates, or due to imbalance of forces on reflector plates due to such factors as misalignment of the plates. The concentric configuration of electrostatic control structure 25 reduces the effect of any imbalance of forces. A benefit of the concentric control structure is that it attracts the movable reflector plate more effectively in its center than a single electrode co-extensive with second reflecting plate 20, reducing the moment arm of any unbalanced forces. This reduces tilt which provides a more uniform gap, which is desirable for a consistent optical response across the pixel. Thus, embodiments of Fabry-Perot light modulator devices made in accordance with the present invention provide a variable optical gap that is substantially free of tilting during variation of the optical gap.

Figure 3:
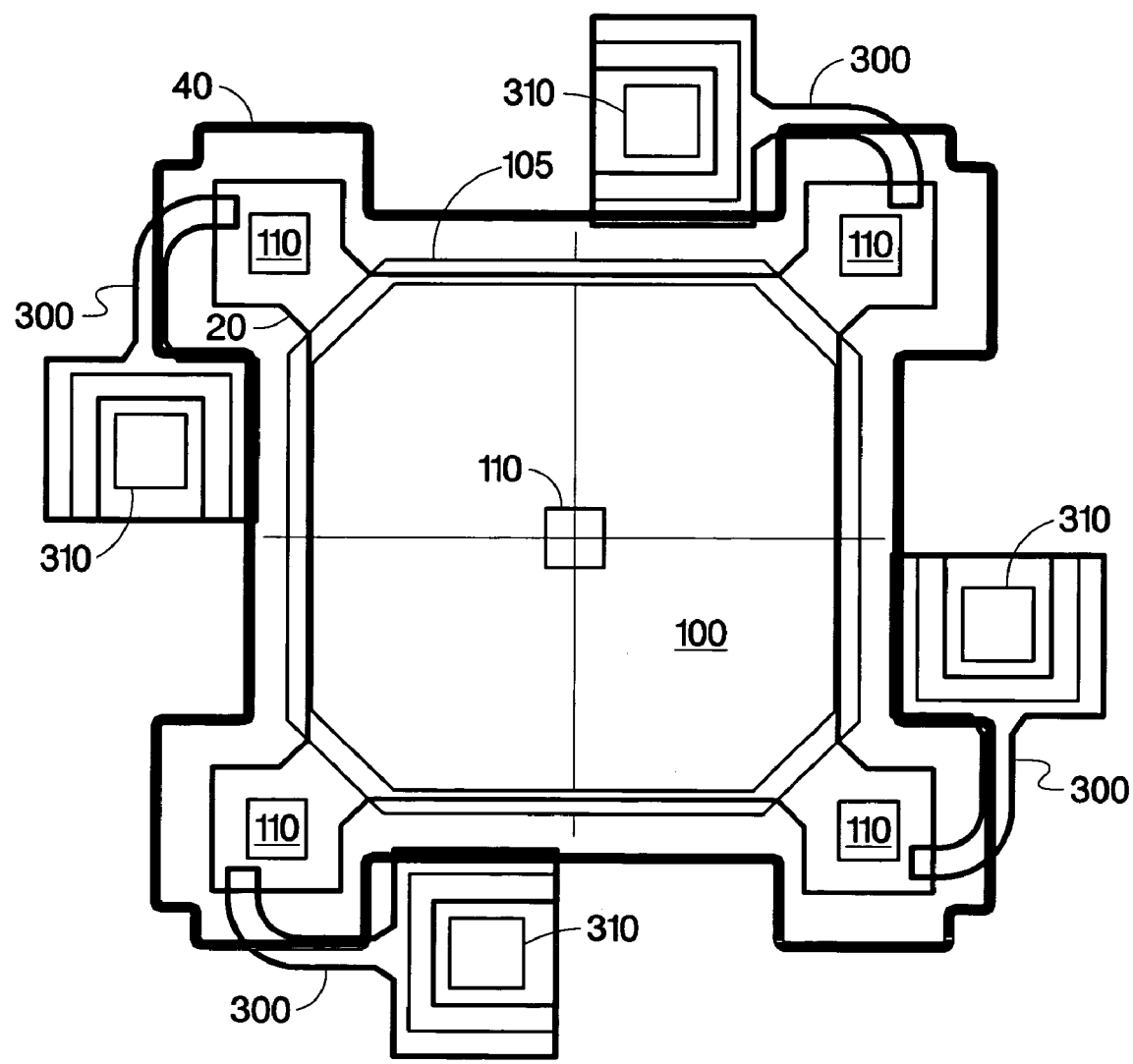
FIG. 3 is a top plan view of another embodiment of a light modulator device.

FIG. 3 shows a top plan view of another embodiment of a light modulator device 10. Reflector plate 20 is supported by flexural elements 300, which are electrically coupled to contact pads 310. Outer electrode 105 is severed in a concentric fashion outside 310 to prevent electrical connection between the flexural elements 300 and electrode 105. Bumps serving as stops 110 are positioned over the center of inner electrostatic control electrode 100 and near the ends of flexural elements 300. Outermost electrode 105 surrounds inner electrostatic control electrode 100. FIG. 3 shows a pixel cell of this embodiment. Any number of such pixel cells may be tiled into an array in which each pixel cell is positioned contiguously with each of its neighboring pixel cells.

Thus, by combining a number of the electronic light modulator-devices 10 (embodiments of the Fabry-Perot interferometers) in an array, embodiments of an optical interference pixel display may be made for displaying multiple pixels simultaneously. Such an array or panel uses multiple light modulator devices made in accordance with the invention, each light modulator device corresponding to a pixel. A number of such arrays or panels may also be combined in a display device so that each pixel displayed is partially displayed by a pixel of each array. For example, in some embodiments, an individual light modulator device may be used to display only one or two colors and black for a pixel. Another corresponding light modulator device in one or more separate panels may be used to display a complete image having the desired hue, saturation, and intensity of each pixel. For example, in a three-panel embodiment (with red, green, and blue RGB panels) displaying a white pixel, the corresponding light modulator devices of all panels would be set to their respective colors and the combination of R, G, and B would form the desired white pixel after being optically combined. Alternatively, or additionally, time-domain combinations may be used. In all such embodiments, each individual physical light modulator device only partially displays the characteristics of a pixel. Thus, partial display of a pixel is useful in such embodiments.

Another embodiment of an electronic light modulator device made in accordance with the invention has first and second reflectors defining an optical cavity between them, the optical cavity again being selective of an electromagnetic wavelength by optical interference, and the device having at least first and second optical states. The optical states are characterized by first and second optical gaps respectively, and the device may have a range of intermediate optical gaps between the first and second optical gaps. Any of the first, second, and intermediate optical gaps may be selected by varying an electric field applied to at least one of the first and second reflectors.

From another point of view, embodiments of an electronic light modulator device made in accordance with the invention have first and second reflectors defining between them an optical cavity selective of an electromagnetic wavelength by optical interference and the electronic light modulator device embodiments have at least four electrodes. The first electrode is coupled to the first reflector, the second electrode is coupled to the second reflector, the third electrode is an inner electrostatic control electrode of a concentric control-electrode structure, and the fourth electrode is an outermost electrode of a concentric control-electrode structure. Thus, a number of optical states are selectable by selectively applying an electric potential between at least two of the first, second, and third or fourth electrodes.

Embodiments of the light modulators 10 may be fabricated by providing a substrate having at least an insulating surface, depositing and patterning a concentric conductive electrode structure 25 on the insulating surface, depositing a first layer of sacrificial material, forming a first reflecting plate 20 having a reflective surface 30, depositing a second layer of sacrificial material, forming a second reflecting plate 40 having a surface 50 that is at least partially reflective, and removing the first and second layers of sacrificial material to release at least the second reflecting plate 40. In at least one embodiment, the first reflecting plate 20 may also be released. The insulating surface of the substrate may comprise silicon oxide or silicon nitride, for example. The control structure 25 comprises at least two concentric electrodes, an inner electrode 100 and an outermost electrode 105. The sacrificial material may comprise amorphous silicon, photoresist, polyimide, or any of a number of other sacrificial materials known in the art of MEMS fabrication. Each of the layers of sacrificial material may be planarized after depositing them, e.g., by chemical-mechanical polishing (CMP). Reflecting plate 20 and flexural elements that support it may be formed of metal, for example. Reflecting surfaces 30 and 50 may be formed of aluminum, for example. Stops 110 may be formed integrally with the reflecting plates.

INDUSTRIAL APPLICABILITY

Devices made in accordance with the invention are useful in display devices that have high spatial and time resolution, high brightness, and a range of colors, with low-power driving requirements. They may also be used in imaging systems such as projectors, in optical addressing applications, and in instrumentation applications.

Although the foregoing has been a description and illustration of specific embodiments of the invention, various modifications and changes thereto can be made by persons skilled in the art without departing from the scope and spirit of the invention as defined by the following claims. For example, additional concentric electrodes may be disposed between inner electrode 100 and outermost electrode 105, and such intermediate electrodes may have other electrical potentials applied to them, which may be intermediate between those of the inner and outermost electrodes, for example. Also, additional capacitor pads may be disposed and adapted for fine control of reflective element position, for correction of unwanted tilt, or for other purposes.

What is claimed is:

1. An electronic device for at least partially displaying a pixel of an image, the device comprising first and second reflectors defining an optical cavity therebetween, the optical cavity being selective of an electromagnetic wavelength at an intensity by optical interference, the device having a concentric control structure comprising at least an inner and an outermost electrode, at least the inner and outermost electrodes being substantially coplanar, and the optical cavity being controlled by the inner electrode.

2. The electronic device of claim 1 formed as a MEMS device.

3. The electronic device of claim 1, wherein the first and second reflectors form a Fabry-Perot interferometer.

4. An optical interference pixel display comprising a plurality of the electronic devices of claim 1.

5. The electronic device of claim 1, wherein the outermost electrode substantially surrounds the inner electrode.

6. An electronic device for displaying a pixel of an image, comprising in combination:
   means for causing interference of electromagnetic radiation including at least two substantially parallel means for reflecting the electromagnetic radiation, and
   concentric means for controlling at least one of the at least two means for reflecting, having at least inner and outer substantially coplanar portions, the means for reflecting being controlled by the inner portion of the concentric means for controlling.

7. An optical interference pixel display comprising a plurality of the electronic devices of claim 6.

8. A Fabry-Perot interferometer, comprising:
   a) substantially parallel first and second reflector plates having first and second reflecting surfaces respectively, at least one of the first and second reflecting plates being movable, the first and second reflecting surfaces being spaced apart by a variable optical gap between the first and second reflecting surfaces; and
   b) a fixed electrostatic control structure adapted to control the variable optical gap by application of a control voltage,
   the control structure being spaced apart from the first reflector plate by a first distance and being spaced apart from the second reflector plate by a second distance smaller than the first distance, and
   the control structure comprising at least two concentric substantially coplanar electrodes.

9. The Fabry-Perot interferometer of claim 8, wherein the second reflector plate is disposed between the first reflector plate and the control structure.

10. The Fabry-Perot interferometer of claim 8, wherein the first reflecting plate is disposed above the second reflecting plate.

11. The Fabry-Perot interferometer of claim 8, wherein the control structure comprising at least two concentric substantially coplanar electrodes is disposed below the second reflecting plate.

12. The Fabry-Perot interferometer of claim 8, wherein the at least two concentric substantially coplanar electrodes include at least an inner electrode and an outermost electrode.

13. The Fabry-Perot interferometer of claim 12, wherein the variable optical gap is controllable by applying a control voltage to the inner electrode.

14. The Fabry-Perot interferometer of claim 8, wherein the electrostatic control structure is centered under the second reflecting plate.

15. The Fabry-Perot interferometer of claim 8, wherein the variable optical gap is controlled by variably pulling the second reflecting plate toward the electrostatic control structure.

16. The Fabry-Perot interferometer of claim 8, wherein the variable optical gap is controlled by moving the second reflecting plate toward the electrostatic control structure substantially without tilting the second reflecting plate.

17. An optical interference pixel display comprising a plurality of the Fabry-Perot interferometers of claim 16.

18. The Fabry-Perot interferometer of claim 8, wherein the control voltage is continuously controllable by an analog signal.

19. An optical interference pixel display comprising a plurality of the Fabry-Perot interferometers of claim 18.

20. The Fabry-Perot interferometer of claim 8, wherein the control voltage is controllable by a digital signal.

21. The Fabry-Perot interferometer of claim 20, wherein the digital signal has a binary value, and wherein a binary zero sets a first optical state and a binary one sets a second optical state.

22. An optical interference pixel display comprising a plurality of the Fabry-Perot interferometers of claim 20.

23. The Fabry-Perot interferometer of claim 20, wherein the digital signal has a plurality of values determined by a plurality of bits.

24. An optical interference pixel display comprising a plurality of the Fabry-Perot interferometers of claim 23.

25. The Fabry-Perot interferometer of claim 8, wherein at least one of the at least two concentric electrodes is held at a fixed electric potential, and wherein the second reflecting plate is electrically coupled to a signal source.

26. The Fabry-Perot interferometer of claim 25, wherein the first reflecting plate is held at a fixed electric potential.

27. The Fabry-Perot interferometer of claim 26, wherein the fixed electric potential is above ground.

28. An optical interference pixel display comprising a plurality of the Fabry-Perot interferometers of claim 25.

29. The Fabry-Perot interferometer of claim 8, wherein the inner electrode of the at least two concentric substantially coplanar electrodes is electrically coupled to a signal source.

30. The Fabry-Perot interferometer of claim 29, wherein the first and second reflecting plates are electrically coupled.

31. An optical interference pixel display comprising a plurality of the Fabry-Perot interferometers of claim 8.

32. The Fabry-Perot interferometer of claim 12, wherein the outermost electrode substantially surrounds the inner electrode.

33. An electronic device for at least partially displaying a pixel of an image, the device comprising first and second reflectors defining an optical cavity therebetween, the first reflector being fixed and comprising a partially reflective surface and the second reflector being movable and comprising a reflective surface, the optical cavity being selective of an electromagnetic wavelength at an intensity by optical interference, the device having a concentric control structure comprising at least an inner and an outermost electrode, at least the inner and outermost electrodes being substantially coplanar, and selected positions of the movable second reflector being controlled by the inner electrode, whereby the optical cavity is controlled.

34. The electronic device of claim 33, wherein the outermost electrode substantially surrounds the inner electrode.

* * * * *